United States Patent
Besshi et al.

(10) Patent No.: US 12,232,300 B2
(45) Date of Patent: Feb. 18, 2025

(54) POWER SEMICONDUCTOR DEVICE AND METHOD FOR MANUFACTURING POWER SEMICONDUCTOR DEVICE

(71) Applicant: Mitsubishi Electric Corporation, Tokyo (JP)

(72) Inventors: Noriyuki Besshi, Tokyo (JP); Ryuichi Ishii, Tokyo (JP); Masaru Fuku, Tokyo (JP); Kazuya Fukuhara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 569 days.

(21) Appl. No.: 16/475,287

(22) PCT Filed: Nov. 30, 2017

(86) PCT No.: PCT/JP2017/043029
§ 371 (c)(1),
(2) Date: Jul. 1, 2019

(87) PCT Pub. No.: WO2018/131310
PCT Pub. Date: Jul. 19, 2018

(65) Prior Publication Data
US 2019/0343015 A1    Nov. 7, 2019

(30) Foreign Application Priority Data
Jan. 13, 2017   (JP) .................................. 2017-004447

(51) Int. Cl.
*H05K 7/20*    (2006.01)
*H01L 23/28*   (2006.01)
(Continued)

(52) U.S. Cl.
CPC .............. *H05K 7/205* (2013.01); *H01L 23/28* (2013.01); *H01L 25/07* (2013.01); *H01L 25/18* (2013.01);
(Continued)

(58) Field of Classification Search
CPC .......... H05K 3/306; H05K 3/34; H05K 13/04; H05K 2201/10151; H05K 2201/10166;
(Continued)

(56) References Cited

U.S. PATENT DOCUMENTS 7,206,204 B2    4/2007   Nakatsu et al.
2003/0206399 A1*  11/2003  Chung .................. H05K 1/021
                                                        361/705
(Continued)

FOREIGN PATENT DOCUMENTS

CN    101010861 A       8/2007
DE    112005002218 T5    8/2007
(Continued)

OTHER PUBLICATIONS

International Search Report (PCT/ISA/210) issued on Feb. 20, 2018, by the Japan Patent Office as the International Searching Authority for International Application No. PCT/JP2017/043029.
(Continued)

*Primary Examiner* — Shaun M Campbell
*Assistant Examiner* — Aneta B Cieslewicz
(74) *Attorney, Agent, or Firm* — BUCHANAN, INGERSOLL & ROONEY PC

(57) ABSTRACT

A power semiconductor device includes: a plurality of power modules including control terminals; a heat sink, on which the plurality of power modules are mounted; and a control substrate, to which the control terminals are fixed. The plurality of power modules each include a first protruding portion close to the control terminals, and a second protruding portion far from the control terminals. The heat sink has, at a position corresponding to the first protruding portion, a first recessed portion formed to have an inner diameter larger than an outer diameter of the first protruding portion, and engaged with the first protruding portion. At a
(Continued)

position corresponding to the second protruding portion, the heat sink has a second recessed portion formed to have the shape of an elongated hole whose minor diameter is larger than an outer diameter of the second protruding portion, and engaged with the second protruding portion.

21 Claims, 10 Drawing Sheets

(51) Int. Cl.
*H01L 23/32* (2006.01)
*H01L 23/36* (2006.01)
*H01L 25/07* (2006.01)
*H01L 25/11* (2006.01)
*H01L 25/18* (2023.01)
*H05K 1/02* (2006.01)
*H05K 3/30* (2006.01)
*H05K 3/34* (2006.01)
*H05K 13/04* (2006.01)

(52) U.S. Cl.
CPC .............. *H05K 1/021* (2013.01); *H05K 3/306* (2013.01); *H05K 3/34* (2013.01); *H05K 13/04* (2013.01); *H01L 23/32* (2013.01); *H01L 23/36* (2013.01); *H01L 25/115* (2013.01); *H05K 2201/066* (2013.01); *H05K 2201/10151* (2013.01); *H05K 2201/10166* (2013.01)

(58) Field of Classification Search
CPC .. H05K 2201/066; H05K 7/205; H05K 3/303; H05K 3/3421; H05K 1/0201–021; H05K 7/20; H05K 7/2039–20518; H05K 7/2089; H05K 3/321; H01L 23/36; H01L 23/32; H01L 23/28; H01L 25/18; H01L 23/367; H01L 25/07–072; H01L 25/10–13; H01L 25/16
See application file for complete search history.

(56) References Cited

U.S. PATENT DOCUMENTS

| | | | |
|---|---|---|---|
| 2008/0007919 A1 | 1/2008 | Isomoto et al. | |
| 2009/0068540 A1* | 3/2009 | Hayashi | H01M 8/0276 29/730 |
| 2010/0059875 A1* | 3/2010 | Sato | H01L 24/40 257/E23.079 |
| 2014/0362540 A1 | 12/2014 | Hatasa et al. | |
| 2015/0028462 A1 | 1/2015 | Hasegawa et al. | |
| 2017/0236774 A1 | 8/2017 | Fushie et al. | |
| 2018/0098421 A1* | 4/2018 | Cai | H05K 7/2049 |

FOREIGN PATENT DOCUMENTS

| | | | | |
|---|---|---|---|---|
| EP | 0693820 A1 | 1/1996 | | |
| JP | H0239488 A | 2/1990 | | |
| JP | H0833336 A | 2/1996 | | |
| JP | H10256421 A | 9/1998 | | |
| JP | 2003329017 A | 11/2003 | | |
| JP | 2004259791 A | 9/2004 | | |
| JP | 2008047634 A | 2/2008 | | |
| JP | 2009130177 A | 6/2009 | | |
| JP | 2009188327 A | 8/2009 | | |
| JP | 2014045629 A | 3/2014 | | |
| JP | 2014236191 A | * 12/2014 | ............. H05K 3/306 |
| JP | 2016051878 A | * 4/2016 | ............. H05K 3/306 |
| WO | 2014013705 A1 | 1/2014 | | |
| WO | 2016084180 A1 | 6/2016 | | |

OTHER PUBLICATIONS

Written Opinion (PCT/ISA/237) issued on Feb. 20, 2018, by the Japan Patent Office as the International Searching Authority for International Application No. PCT/JP2017/043029.

Office Action dated Sep. 30, 2021, issued in corresponding German Patent Application No. 112017006 813.4, 16 pages including 7 pages of English Translation.

Office Action dated Aug. 29, 2022, issued in the corresponding Chinese Patent Application No. 201780081888.8, 13 pages including 6 pages of English Translation.

* cited by examiner

POWER SEMICONDUCTOR DEVICE AND METHOD FOR MANUFACTURING POWER SEMICONDUCTOR DEVICE

TECHNICAL FIELD

The present invention relates to a power semiconductor device including a mechanism for preventing erroneous mounting of a power module, and a method of manufacturing the power semiconductor device.

BACKGROUND ART

In recent years, power semiconductor devices have been beginning to be widely used in automobiles in addition to general industries and railways. An increased ratio of automobiles are being electrified in the forms of, for example, a hybrid vehicle, which uses an engine and a motor both as drive sources, and an electric vehicle, which uses a motor alone as a drive source.

An electrified vehicle is required to be reduced in the size and weight of each part within a limited space in order to help to improve fuel efficiency of the vehicle. A hybrid vehicle is particularly limited in the layout of parts because an engine and a motor are required to share an engine room and a space in which peripheral parts are arranged is consequently small. Accordingly, downsizing of a power semiconductor device increases the degree of freedom in the layout of parts in the small space of the engine room, and leads to the downsizing of the vehicle itself as well. In-vehicle power semiconductor devices are strongly demanded to be downsized for such reasons (see Patent Literature 1, for example).

A trend among in-vehicle power semiconductor devices is to integrate a plurality of types of power converters for the purpose of space saving and cost reduction. For instance, a system using two motors to efficiently manage drive energy and regenerative energy requires two direct current-alternating current conversion circuits in order to drive the two motors separately. The system also requires a step-up converter circuit to obtain a desired system voltage and current through boosting with the use of a step-up converter while keeping an input voltage from a battery low. Those three circuits are accommodated on the same substrate to be used as a function-integrated power semiconductor device.

Constituent parts of a power semiconductor device include a power module, a control substrate, a capacitor, a cooler, and a reactor. Of those listed parts, main parts that determine the size of the power semiconductor device are the power module and the control substrate. When two direct current-alternating current conversion circuits and one step-up converter are mounted on one control substrate, it is preferred to use the same power module in each of the circuits in order to avoid erroneous mounting of the circuits on the control substrate.

The power module type used in this case is required to be the type of the power module in the circuit that has the highest output voltage out of output voltages required of the three circuits. However, this means that a power module larger than required is used in other circuits, and the control substrate is set to an unnecessarily large size as well in order to mount the power module. The control substrate is therefore downsized by using a different power module in each of the three circuits so that the power module is suitable for the output voltage required of the circuit.

CITATION LIST

Patent Literature

[PTL 1] JP 2004-259791 A

SUMMARY OF INVENTION

Technical Problem

However, when a different power module is mounted in each of three circuits accommodated on one control substrate, there is a fear that a power module intended for one of the circuits is mounted in another circuit by mistake.

The present invention has been made to solve the problem described above, and an object of the present invention is to provide a power semiconductor device capable of preventing erroneous mounting of a plurality of types of power modules to be mounted on the same control substrate, and a method of manufacturing the power semiconductor device.

Solution to Problem

A power semiconductor device according to one embodiment of the present invention includes: a plurality of power modules, to which control terminals are mounted; a heat sink, on which the plurality of power modules are mounted; and a control substrate having a fixing portion, to which the control terminals are to be fixed, formed thereon. Each of the plurality of power modules each includes a first protruding portion and a second protruding portion. The first protruding portion is formed at a position closer to the control terminals than the second protruding portion is formed. The heat sink has a first recessed portion to be engaged with the first protruding portion at a position corresponding to the first protruding portion when the plurality of types of power modules are mounted. The heat sink further has a second recessed portion to be engaged with the second protruding portion at a position corresponding to the second protruding portion when the plurality of types of power modules are mounted. The first recessed portion is formed to have an inner diameter greater than an outer diameter of the first protruding portion. The second recessed portion is formed to have a shape of an elongated hole having a minor diameter that is greater than an outer diameter of the second protruding portion.

Advantageous Effects of Invention

According to the power semiconductor device of one embodiment of the present invention, erroneous mounting of a power module can be prevented when a plurality of different power modules are mounted on one control substrate.

DESCRIPTION OF EMBODIMENTS

Now, with reference to the drawings, a power semiconductor device according to each of preferred embodiments of the present invention is described.

First Embodiment

Figure 1:
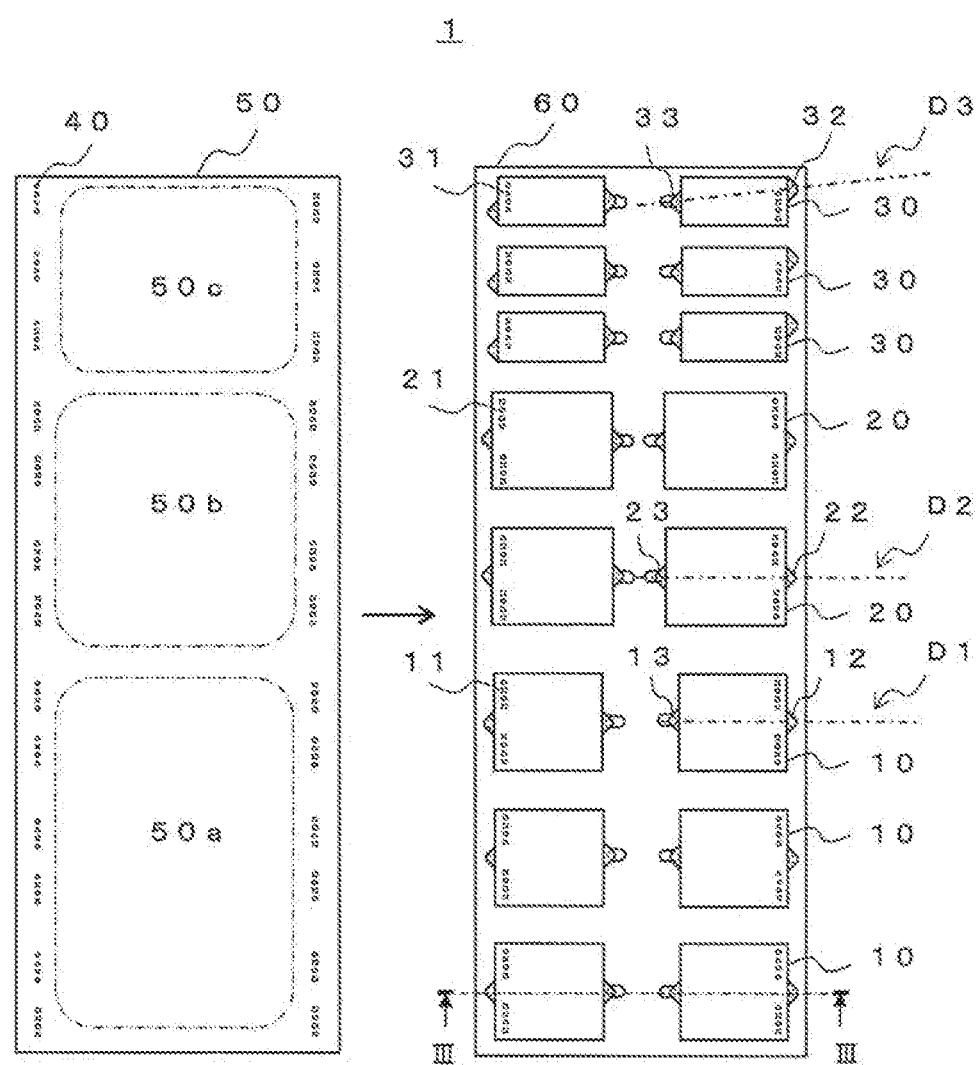
FIG. 1 is a top view of a power semiconductor device according to a first embodiment of the present invention.
Figure 2:
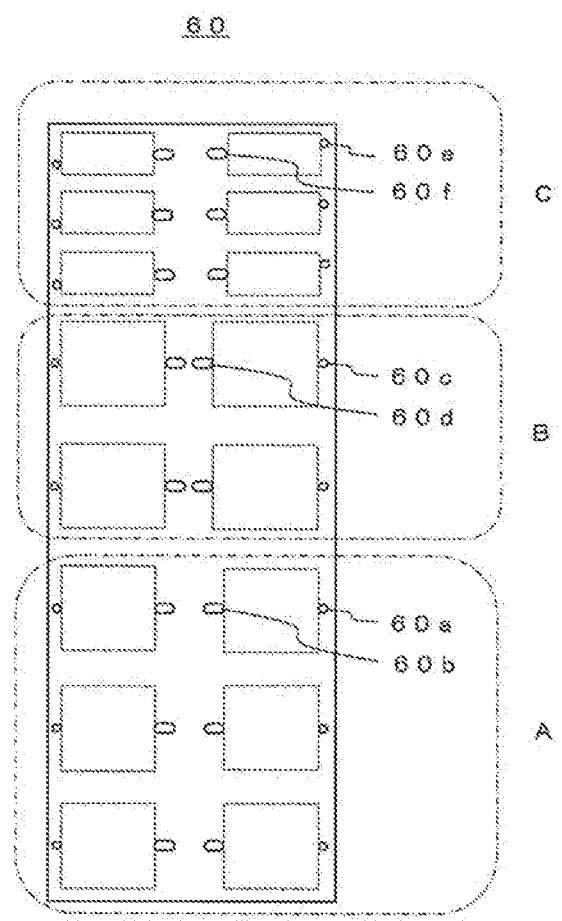
FIG. 2 is a top view of a heat sink, which is a constituent part of the power semiconductor device according to the first embodiment.
Figure 3:
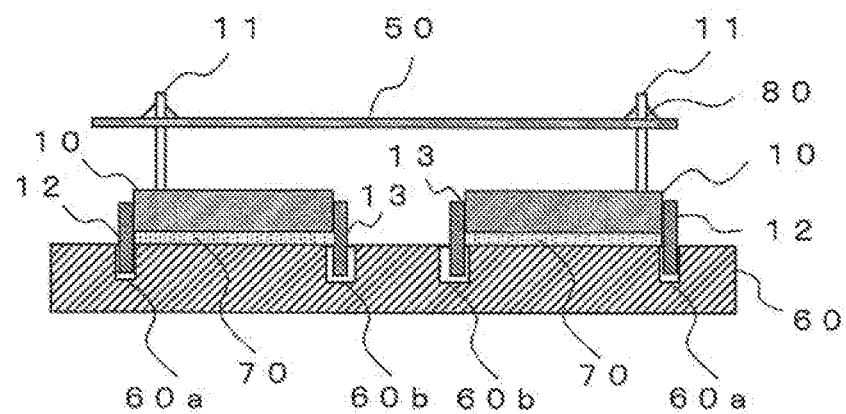
FIG. 3 is a sectional view of the power semiconductor device taken along the line III-III of FIG. 1.

FIG. 1 is a top view of a power semiconductor device 1 according to a first embodiment of the present invention. FIG. 2 is a top view of a heat sink 60, which is a constituent part of the power semiconductor device 1. FIG. 3 is a sectional view of the power semiconductor device 1 taken along the line III-III of FIG. 1. FIG. 4A to FIG. 4D are a top view, a front view, a rear view, and a side view, respectively, of a power module 10. Similarly, FIG. 5A to FIG. 5D are a top view, a front view, a rear view, and a side view, respectively, of a power module 20, and FIG. 6A to FIG. 6D are a top view, a front view, a rear view, and a side view, respectively, of a power module 30.

As illustrated in FIG. 1, the power semiconductor device 1 includes one control substrate 50, one heat sink 60, and a plurality of power modules 10, 20, and 30. The control substrate 50 is detached in FIG. 1 in order to make it easier to see the arrangement of the power modules 10, 20, and 30.

As illustrated in FIG. 1, three circuits, namely, a direct current-alternating current conversion circuit 50a, a direct current-alternating current conversion circuit 50b, and a step-up converter circuit 50c, are formed on amounting surface of the control substrate 50. The direct current-alternating current conversion circuit 50a serves as a motor drive circuit to which the power modules are connected. The direct current-alternating current conversion circuit 50b serves as a motor drive circuit to which the power modules 20 are connected. The power modules 30 are connected to the step-up converter circuit 50c. The control substrate 50 also has a plurality of mounting holes 40, to which control terminals 11, 21, and 31 of the power modules 10, 20, and 30, respectively, are fixed.

The heat sink 60 is divided into three areas, namely, areas A to C as indicated by the dash-dot-dot lines in FIG. 2. The area A is an area in which six power modules 10 are mounted. The area B is an area in which four power modules 20 are mounted. The area C is an area in which six power modules 30 are mounted. Recessed portions 60a and 60b, recessed portions 60c and 60d, and recessed portions 60e and 60f for positioning the power modules 10, 20, and 30, respectively, are formed in the areas A, B, and C, respectively.

The recessed portions 60a, 60c, and 60e are formed to have a cylindrical shape, and the recessed portions 60b, 60d, and 60f are shaped as elongated holes each shaped by connecting two semicircles to each other by two straight lines. The recessed portions 60b, 60d, and 60f are formed to have the elongated hole shape in order to deal with dimensional changes caused by thermal expansion of the heat sink 60 or the power modules 10, 20, and 30, and dimensional fluctuations of the heat sink 60 or the power modules 10, 20, and 30 due to a manufacturing error.

The heat sink 60 is formed from a material chosen after comprehensive consideration of differences in linear expansion coefficient from the power modules, heat conductivity, weight, cost, and other factors. When a ceramic substrate with a pattern on each side, which is created by bonding Cu, Al, or a similar electrode material to each side of an insulating material, for example, Si3N4 or AlN, is used in the power modules 10, 20, and 30, the difference in linear expansion coefficient at a pattern thickness within the range of pattern thicknesses used in practice (from 0.3 mm to 1.0 mm) is from 7 ppm/K to 12 ppm/K, and thus the ceramic substrate is a small-thermal expansion material. A composite material such as AlSiC or CuMo is accordingly favorable when importance is given to the difference in liner expansion coefficient between the heat sink 60 and the power modules 10, 20, and 30. When Cu and a resin insulating material are used as main materials of the power modules 10, 20, and 30, on the other hand, the linear expansion coefficient of Cu (16.8 ppm/K) is used as a rough indicator, and Cu or Al is accordingly favorable as the heat sink material. Note that, the combinations given above are not the only favorable materials because factors other than the difference in linear expansion coefficient are to be considered as well.

FIG. 3 is a sectional view of the power semiconductor device 1 taken along the lines III-III of FIG. 1. The control substrate 50, which is illustrated in a detached state in FIG. 1, is illustrated in a mounted state in FIG. 3. The description given here takes as an example a portion in which the power modules 10 are fixed to the heat sink 60. The configuration of this example, except dimensions, is the same also for portions in which the power modules 20 and 30 are fixed to the heat sink 60.

As illustrated in FIG. 3, control terminals 11 are mounted to each power module 10 to protrude toward a space above the power module 10. The control substrate 50 is fixed to upper portions of the control terminals 11. The control terminals 11 are inserted into the mounting holes 40, which are formed in the control substrate 50 illustrated in FIG. 1, and a fixing member 80 fixes the control substrate 50 to the inserted control terminals 11.

The power module 10 includes a protruding portion 12, which is formed to have a columnar shape and which protrudes toward a bottom surface of the power module 10, in an end portion of the power module 10 on the side on which the control terminals 11 are mounted. The power module 10 includes another protruding portion 13, which is formed to have a columnar shape and which protrudes toward the bottom surface of the power module 10, in an end portion of the power module 10 on the opposite side from the end portion in which the protruding portion 12 is formed. The recessed portion 60a corresponding to the protruding portion 12 and the recessed portion 60b corresponding to the protruding portion 13 are formed in the heat sink 60. The protruding portions 12 and 13 are inserted to the recessed portions 60a and 60b of the heat sink 60, respectively, to thereby position the power module 10. The power module 10 is fixed to the heat sink 60 by a fixing layer 70.

A material having a fixing function, high in heat radiation performance, and small in long-term deterioration, for example, solder or an electrically conductive adhesive, is used for the fixing layer 70 and the fixing material 80. A sintered Ag material, a sintered Cu material, a sintered CuSn material, or a material similarly durable at a higher temperature than solder or an electrically conductive adhesive may also be used for the fixing layer 70 and the fixing material 80. While bonding surfaces of the heat sink 60 and the power module 10 require no particular surface treatment when the material of the fixing layer 70 is an electrically conductive adhesive, bonding to an Al-based material is difficult when solder or a sintered material is used to bond metals. In the latter case, fine bonding is accomplished by performing surface treatment such as electrolytic Ni plating, electroless NiP plating, or Sn plating.

The power modules 10, 20, and 30 are connected to the circuits 50a, 50b, and 50c, respectively, and are each configured with the use of a power chip optimum for the connected circuit. Consequently, there is almost no interchangeability in terms of power between the power modules 10, 20, and 30. This means that the power semiconductor device 1 on the whole experiences power excess/shortage unless a power module of a prescribed type is mounted in a prescribed place.

The power semiconductor device 1 according to the first embodiment is therefore provided with a mechanism for preventing erroneous mounting of the power modules 10, 20, and 30. The mechanism for preventing erroneous mounting of the power modules 10, 20, and 30 in the first embodiment is described below.

As illustrated in FIG. 2, six pairs of the recessed portions 60a and 60b are formed in the area A of the heat sink 60. Four pairs of the recessed portions 60c and 60d are formed in the area B. Six pairs of the recessed portions 60e and 60f are formed in the area C.

Figure 4A:
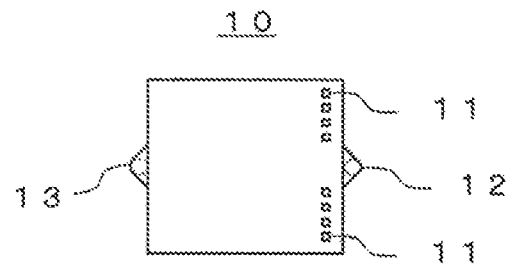
FIG. 4A is a top view of a first power module, which is a constituent part of the power semiconductor device according to the first embodiment.
Figure 4B:
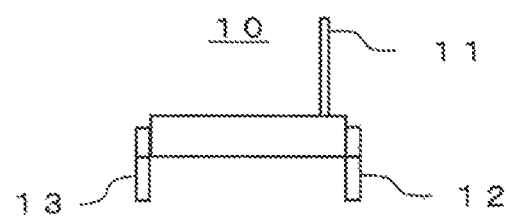
FIG. 4B is a front view of the first power module, which is a constituent part of the power semiconductor device according to the first embodiment.
Figure 4C:
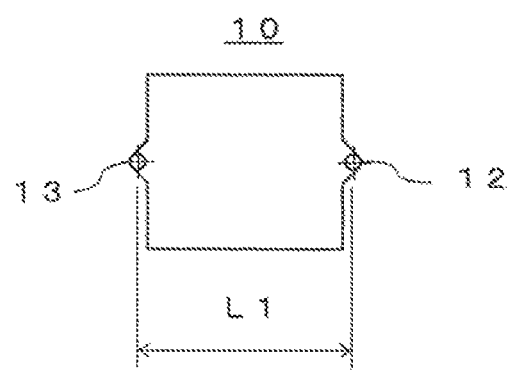
FIG. 4C is a rear view of the first power module, which is a constituent part of the power semiconductor device according to the first embodiment.
Figure 4D:
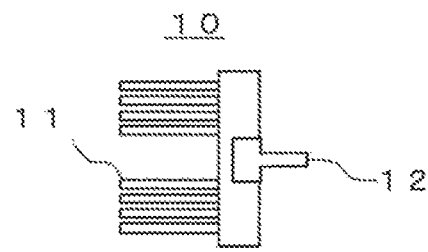
FIG. 4D is a side view of the first power module, which is a constituent part of the power semiconductor device according to the first embodiment.

As illustrated in FIG. 4A and FIG. 4D, each power module 10 includes eight control terminals 11. The control terminals 11 are lines for gate driving of the power chip, and lines for signals to a current sensor and to a temperature sensor built in the chip. Each of the control terminals 11 is mounted to the power module 10 to protrude perpendicularly to a mounting surface of the heat sink 60 when the power module 10 is mounted to the heat sink 60. The control terminals 11 are each inserted into one of the mounting holes 40 of the control substrate 50 illustrated in FIG. 1, and are soldered to the control substrate 50.

The power module 10 also includes the columnar protruding portion 12 formed on an end surface of the power module 10 on the side on which the control terminals 11 are mounted, and the columnar protruding portion 13 formed on an end surface of the power module 10 on the opposite side. The protruding portion 12 is inserted into one of the recessed portions 60a of the heat sink 60 illustrated in FIG. 2, and the protruding portion 13 is inserted into one of the recessed portions 60b of the heat sink 60. The recessed portion 60a is formed to have an inner diameter slightly greater than the outer diameter of the protruding portion 12. The recessed portion 60b, on the other hand, is formed to have a minor diameter that is greater than the outer diameter of the protruding portion 13 and to have a major diameter large enough to allow the protruding portion 13 to move a little within the recessed portion 60b.

The clearance between the protruding portion 12 and the recessed portion 60a is small, and the clearance between the protruding portion 13 and the recessed portion 60b is large. The protruding portion 12 is inserted into the recessed portion 60a at a small clearance in order to position each of the control terminals 11 mounted near the protruding portion 12 in relation to the arrangement of the mounting holes 40 of the control substrate 50.

In this manner, the power module 10 can be positioned with respect to the heat sink 60 by the insertion of the protruding portions 12 and 13 of the power module 10 into the recessed portions 60a and 60b of the heat sink 60. The control terminals 11 of the power module 10 can then be positioned with respect to the mounting holes 40 of the control substrate 50. The same applies to the power modules 20 and the power modules 30.

Figure 5A:
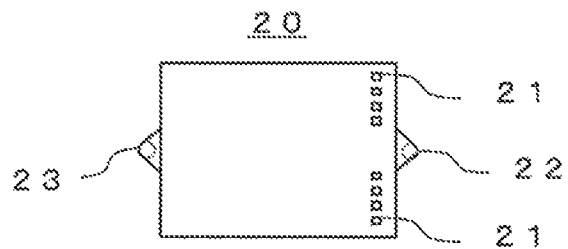
FIG. 5A is a top view of a second power module, which is a constituent part of the power semiconductor device according to the first embodiment.
Figure 5B:
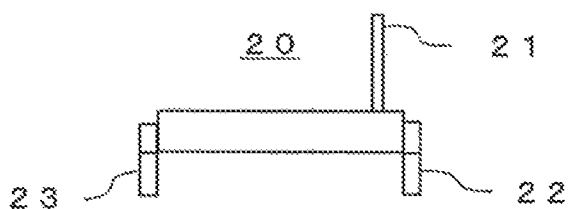
FIG. 5B is a front view of the second power module, which is a constituent part of the power semiconductor device according to the first embodiment.
Figure 5C:
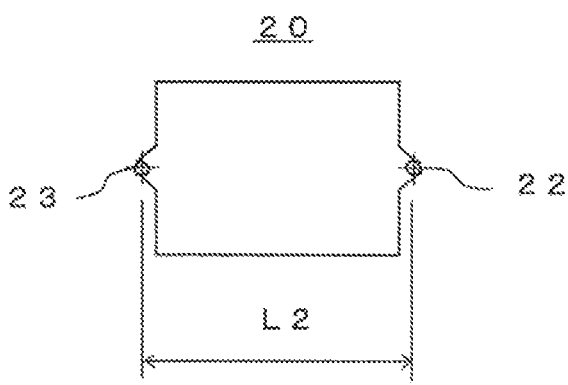
FIG. 5C is a rear view of the second power module, which is a constituent part of the power semiconductor device according to the first embodiment.
Figure 5D:
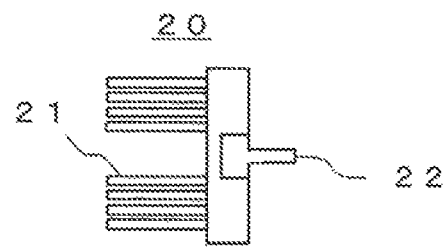
FIG. 5D is a side view of the second power module, which is a constituent part of the power semiconductor device according to the first embodiment.

As illustrated in FIG. 5A and FIG. 5D, each power module 20 includes eight control terminals 21. The control terminals 21 are, similarly to the control terminals 11 of each power module 10, lines for gate driving of the power chip and lines for signals to a current sensor and to a temperature sensor built in the chip. Similarly to the control terminals 11 of each power module 10, the control terminals 21 are mounted to the power module 20 to protrude perpendicularly to the mounting surface of the heat sink 60 when the power module 20 is mounted to the heat sink 60. Similarly to the control terminals 11 of each power module 10, the control terminals 21 are each inserted into one of the plurality of mounting holes 40 formed in the control substrate 50 illustrated in FIG. 1, and are soldered to the control substrate 50.

The power module 20 also includes a columnar protruding portion 22 formed on an end surface of the power module 20 on the side on which the control terminals 21 are mounted, and a columnar protruding portion 23 formed on an end surface of the power module 20 on the opposite side. The protruding portion 22 is inserted into one of the recessed portions 60c of the heat sink 60 illustrated in FIG. 2, and the protruding portion 23 is inserted into one of the recessed portions 60d of the heat sink 60.

The recessed portion 60c is formed to have an inner diameter slightly greater than the outer diameter of the protruding portion 22. The recessed portion 60d, on the other hand, is formed to have a minor diameter that is greater than the outer diameter of the protruding portion 23 and to have a major diameter large enough to allow the protruding portion 23 to move a little within the recessed portion 60d. The recessed portions 60c and 60d are formed in this manner and the protruding portions 22 and 23 of the power module 20 are assembled into the heat sink 60, to thereby position the power module 20 with respect to the heat sink 60.

Figure 6A:
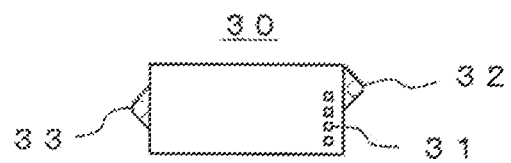
FIG. 6A is a top view of a third power module, which is a constituent part of the power semiconductor device according to the first embodiment.
Figure 6B:
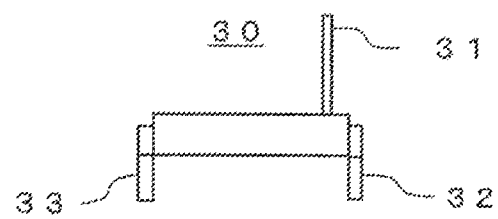
FIG. 6B is a front view of the third power module, which is a constituent part of the power semiconductor device according to the first embodiment.
Figure 6C:
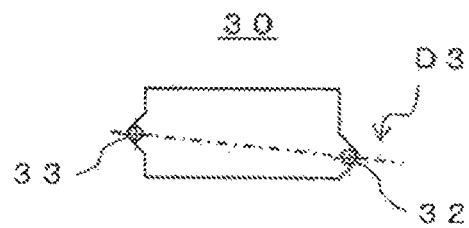
FIG. 6C is a rear view of the third power module, which is a constituent part of the power semiconductor device according to the first embodiment.
Figure 6D:
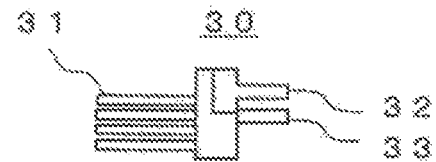
FIG. 6D is a side view of the third power module, which is a constituent part of the power semiconductor device according to the first embodiment.

As illustrated in FIG. 6A and FIG. 6D, each power module 30 includes four control terminals 31. The control terminals 31 are, similarly to the control terminals 11 and 12, lines for gate driving of the power chip and lines for signals to a current sensor and to a temperature sensor built in the chip. Each of the control terminals 31 is mounted to the power module 30 to protrude perpendicularly to the mounting surface of the heat sink 60 when the power module 30 is mounted to the heat sink 60. The control terminals 31 are each inserted into one of the mounting holes 40 of the control substrate 50 illustrated in FIG. 1, and are soldered to the control substrate 50.

The power module 30 also includes a columnar protruding portion 32 formed on an end surface of the power module 30 on the side on which the control terminals 31 are mounted, and a columnar protruding portion 33 formed on an end surface of the power module 30 on the opposite side. The protruding portion 32 is inserted into one of the recessed portions 60e of the heat sink 60 illustrated in FIG. 2, and the protruding portion 33 is inserted into one of the recessed portions 60f of the heat sink 60.

The recessed portion 60e is formed to have an inner diameter slightly greater than the outer diameter of the protruding portion 32. The recessed portion 60f, on the other hand, is formed to have a minor diameter that is greater than the outer diameter of the protruding portion 33 and to have a major diameter large enough to allow the protruding portion 33 to move a little within the recessed portion 60f. The recessed portions 60e and 60f are formed in this manner and the protruding portions 32 and 33 of the power module 30 are assembled into the heat sink 60, to thereby position the power module 30 with respect to the heat sink 60.

As illustrated in FIG. 1, FIG. 6C, and FIG. 6D, the protruding portion 32 formed in the power module 30 is arranged so that the direction of a straight line D3 connecting the protruding portion 32 and the protruding portion 33 is unparallel to and offset from the direction of a straight line D1 connecting the protruding portion 12 and the protruding portion 13 of the power module 10 and the direction of a straight line D2 connecting the protruding portion 22 and the protruding portion 23 of the power module 20. The offset is set so that an angle formed between the straight line D3 and the straight lines D1 and D2 is 5° or more.

A distance L2 between the protruding portion 22 and the protruding portion 23 of the power module 20 illustrated in FIG. 5C is set longer than a distance L1 between the protruding portion 12 and the protruding portion 13 of the power module 10 illustrated in FIG. 4C.

As illustrated in FIG. 2, the arrangement of one pair of the recessed portions 60a and 60b formed in the area A of the heat sink 60 corresponds to the arrangement of one pair of the protruding portions 12 and 13 formed in one power module 10. The arrangement of one pair of the recessed portions 60c and 60d formed in the area B corresponds to the arrangement of one pair of the protruding portions 22 and 23 formed in one power module 20. The arrangement of one pair of the recessed portions 60e and 60f formed in the area C corresponds to the arrangement of one pair of the protruding portions 32 and 33 formed in one power module 30.

The protruding portions 12 and 13 of each power module 10 are designed so that the protruding portions 12 and 13 do not fit in and accordingly cannot be inserted into the recessed portions 60c and 60d in the area B and the recessed portions 60e and 60f in the area C. The protruding portions 22 and 23 of each power module 20 are designed so that the protruding portions 22 and 23 do not fit in and accordingly cannot be inserted into the recessed portions 60a and 60b in the area A and the recessed portions 60e and 60f in the area C. The protruding portions 32 and 33 of each power module 30 are designed so that the protruding portions 32 and 33 do not fit in and accordingly cannot be inserted into the recessed portions 60a and 60b in the area A and the recessed portions 60c and 60d in the area B.

In the power semiconductor device 1 according to the first embodiment, a positional relationship of the two protruding portions included in each power module 10, the positional relationship of the two protruding portions included in each power module 20, and the positional relationship of the two protruding portions included in each power module 30 are varied from one another in this manner. Combined with this, the recessed portions 60a and 60b formed in the area A of the heat sink 60, the recessed portions 60c and 60d formed in the area B, and the recessed portions 60e and 60f formed in the area C are arranged so that the arrangement of the recessed portions in the area A, the arrangement of the recessed portions in the area B, and the arrangement of the recessed portions in the area C correspond to the positional relationship of the protruding portions in each power module 10 mounted in the area A, the positional relationship of the protruding portions in each power module 20 mounted in the area B, and the positional relationship of the protruding portions in each power module 30 mounted in the area C, respectively. A mistake in which a power module is mounted in an area that is not an area in which the power module is to be mounted can thus be prevented for the power modules 10, 20, and 30.

The power semiconductor device 1 includes six power modules 10, four power modules 20, and six power modules 30 in the first embodiment, but the types and numbers of power modules included are not limited thereto. The protruding portions are also not limited to the mode in the first embodiment, in which one pair of protruding portions is formed in each power module. For instance, each power module may be provided with three or more protruding portions.

The protruding portions provided in the power modules have a columnar shape, and the recessed portions formed in the heat sink have a cylindrical shape and the shape of an elongated hole in the first embodiment, but the present invention is not limited thereto. For instance, the protruding portions may have hemispherical tips, or the protruding portions may have the shape of a rectangular column while the recessed portions are shaped as rectangular holes or elongated holes. It is preferred to bevel the tips of the protruding portions when the protruding portions are formed to have the shape of a rectangular column.

In the first embodiment, the protruding portions 32 and 33 of each power module 30 are arranged to be offset, and the distance between the protruding portions 22 and 23 in each power module 20 is varied from the distance between the protruding portions in each of the other power modules 10 and 30, to thereby prevent erroneous mounting of the power modules. However, the present invention is not limited thereto. The erroneous mounting may be prevented by, for example, varying the number or shape of protruding portions from one power module type to another power module type.

In the first embodiment, four control terminals 31 are mounted to each power module 30, eight control terminals 11 are mounted to each power module 10, and eight control terminals 21 are mounted to each power module 20. However, the numbers of control terminals are not limited thereto, and may be changed to suit specifications of the power semiconductor device 1 or the use of the power modules.

The protruding portions formed in the power modules 10, 20, and 30 are preferred to be molded from a resin material compatible with injection molding and high in heat resistance. When lead-free solder is used for the fixing layer 70, in particular, the melting point of the solder is from about 220° C. to about 240° C. and thus, taking temperature fluctuations during the soldering process into consideration, it is preferred that the fixing layer 70 have a heat resistance of 260° C. or higher. Examples of the suitable material include polyphenylene sulfide (PPS), liquid crystal polymer resin, and fluorine-based resin. When a metal-based sintered material is used for the bonding, the processing temperature is within the range of from about 250° C. to about 300° C. in many cases, and a material having further higher heat resistance is accordingly selected to reduce heat deformation of the protruding portions.

Figure 7:
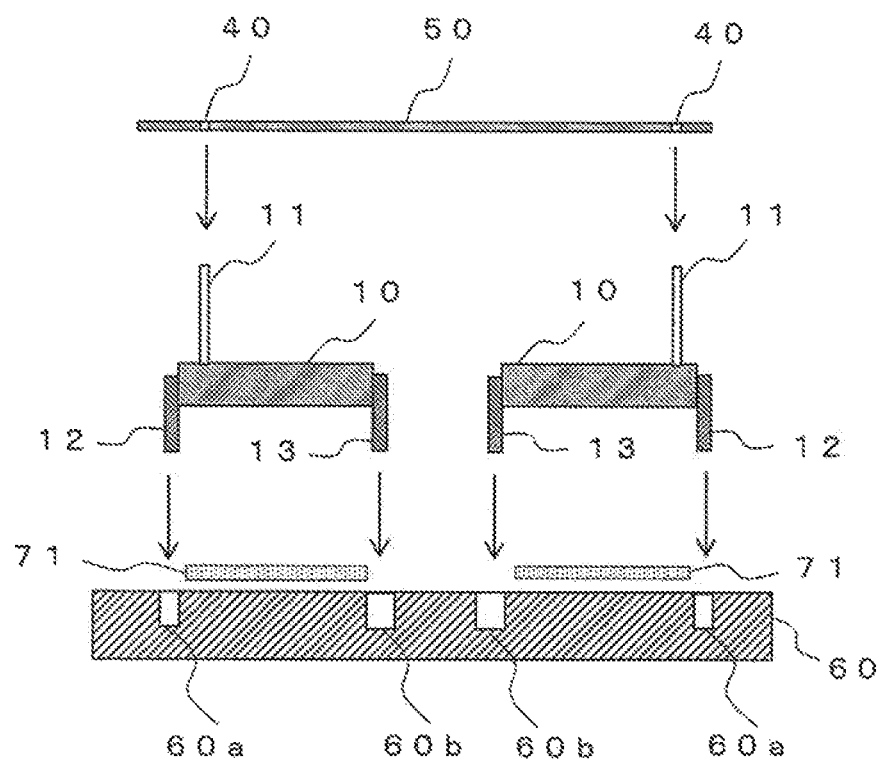
FIG. 7 is a diagram for illustrating a manufacturing procedure in a method of manufacturing a power semiconductor device according to the present invention.

A method of manufacturing the power semiconductor device 1 according to the present invention is described next. FIG. 7 is a diagram for illustrating an assembling procedure of the power semiconductor device 1. FIG. 8A to FIG. 8E are diagrams for illustrating a void removal step in the method of manufacturing the power semiconductor device 1.

Figure 9:
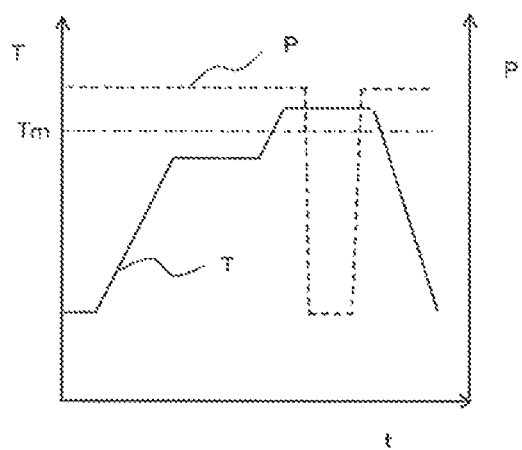
FIG. 9 is a graph for showing the procedure of the void removal step in the method of manufacturing a power semiconductor device.

FIG. 9 is a graph for showing changes with time of a temperature T of the fixing layer 70 by which the power modules 10 are fixed to the heat sink 60, and changes with time of a pressure P of the atmosphere of the fixing layer 70. In FIG. 9, the axis of abscissa indicates a time t, and the axis of ordinate indicates the temperature T of the fixing layer 70 and the pressure P of the atmosphere of the fixing layer 70. The solid line in the graph represents changes in the temperature T of the fixing layer 70, and the broken line represents changes in the pressure P of the atmosphere of the fixing layer 70. The dot-dash line in the graph represents a melting temperature Tm of the fixing layer 70.

The description given here takes the power modules 10 as an example, but applies to the power modules 20 and 30 as well.

As illustrated in FIG. 7, a solder 71 in a cream form is applied first as the fixing layer 70 to places in which the power modules 10 are to be mounted on the mounting surface of the heat sink 60.

Next, in each power module 10, the protruding portion 12 near the control terminals 11 is lined up with and inserted into the corresponding one of the recessed portions 60a of the heat sink 60. The other protruding portion of the power module 10, namely, the protruding portion 13, is next inserted into the corresponding one of the recessed portions 60b of the heat sink 60.

The distance between the protruding portion 12 and protruding portion 13 of the power module 10 is changed by thermal expansion, and also fluctuates due to a manufacturing error. The changes and the fluctuations, however, can be accommodated because each recessed portion 60b is shaped as an elongated hole.

Next, the entire power module 10 is pressed lightly against the heat sink 60 to spread the solder 71 without leaving space between the power module 10 and the heat sink 60.

A void removal step, in which an air bubble generated in the solder and called a void is removed, is executed at this point. A void remaining in the solder 71 cuts off a heat radiation path of the power module 10, and is accordingly required to be removed. The void removal step is described with reference to FIG. 8 and FIG. 9.

Figure 8A:
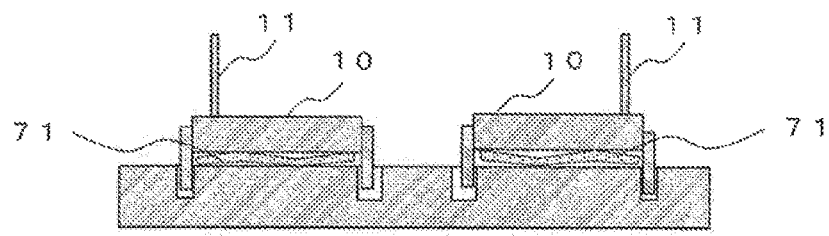
FIG. 8A is a diagram for illustrating a procedure of a void removal step in the method of manufacturing a power semiconductor device.
Figure 8B:
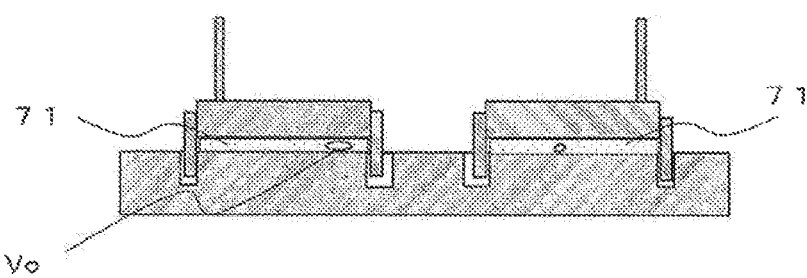
FIG. 8B is a diagram for illustrating the procedure of the void removal step in the method of manufacturing a power semiconductor device.

First, the solder 71 in the state of FIG. 8A is heated and melted by raising the temperature T of the solder 71 to the melting temperature Tm of the solder 71 or higher as shown in FIG. 9. A void Vo then appears in the melted solder 71 as illustrated in FIG. 8B.

Figure 8C:
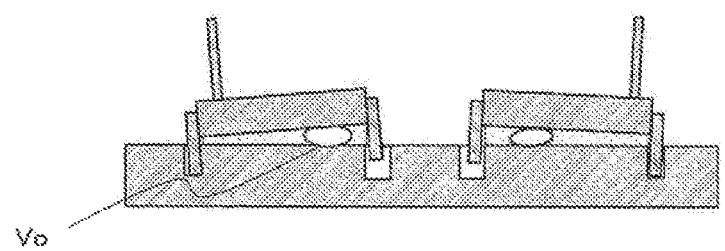
FIG. 8C is a diagram for illustrating the procedure of the void removal step in the method of manufacturing a power semiconductor device.

Next, in the manner shown in FIG. 9, vacuuming is performed on the power semiconductor device 1 to reduce the pressure of the atmosphere of the melted solder 71. The pressure reduction may be started before the solder 71 is heated. As the pressure reduction progresses, the internal pressure of the void Vo caught in the melted solder 71 becomes high relative to the outside, and the void Vo grows larger as illustrated in FIG. 8C. The grown void Vo causes the power module 10 to lift off from the heat sink 60.

Figure 8D:
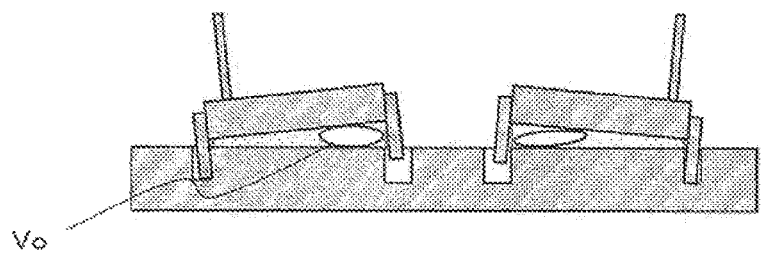
FIG. 8D is a diagram for illustrating the procedure of the void removal step in the method of manufacturing a power semiconductor device.
Figure 8E:
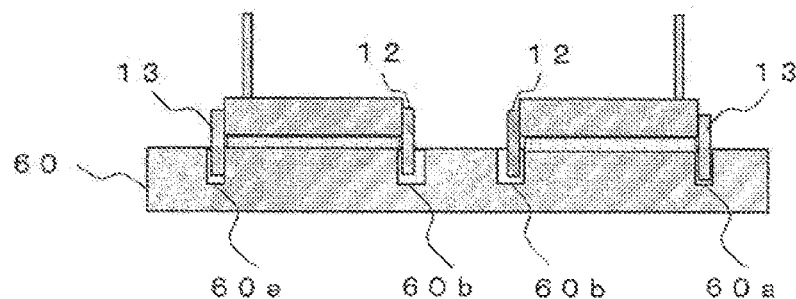
FIG. 8E is a diagram for illustrating the procedure of the void removal step in the method of manufacturing a power semiconductor device.

The pressure reduction is continued at least until the pressure of the atmosphere of the melted solder 71 becomes 10 kPa or lower. This causes the void Vo to grow further and reach an end portion of the layer of the solder 71 as illustrated in FIG. 8D. The interior of the void Vo then communicates to the outside of the melted solder 71, thereby expelling air in the void Vo to the outside of the melted solder 71. At this point, as illustrated in FIG. 8E, the power module 10 lifted from the heat sink 60 sinks back into the heat sink 60.

When the movement of the power module 10 settles down, as shown in FIG. 9, the pressure reduction is ceased to return the pressure of the atmosphere of the melted solder 71 to the atmospheric pressure. In the case of a failure to expel the void Vo in the melted solder 71, the remaining void Vo behaves to shrink when the melted solder 71 is returned from the reduced pressure to the atmospheric pressure. The size of the void Vo is made as small as possible by the shrinkage. On the other hand, a shift in the location of the void Vo in the process of void shrinking causes the power module 10 to lift, or the shrinking of the void Vo causes the power module 10 to sink down. The positional shift of the power module 10 can be minimized despite the lifting or sinking of the power module 10, because of the protruding portions provided in the power module 10 and the recessed portions formed in the heat sink.

The heating of the melted solder 71 is then ceased. This completes the void removal step.

Next, when the melted solder 71 is solidified, the control substrate 50 is mounted to the plurality of control terminals 11, 21, and 31 of the power modules 10, 20, and 30. Specifically, the control substrate 50 is pressed down along the control terminals 11, 21, and 31 until the control terminals 11, 21, and 31 protrude from the mounting holes 40 of the control substrate 50 for a length long enough for soldering.

Next, upper portions of the control terminals 11, 21, and 31 that are protruding from the control substrate 50 are soldered to the control substrate 50. This completes the manufacturing of the power semiconductor device 1.

In the void removal step, the power module 10 behaves to lift off from the heat sink 60 and then sink down. When a diagonal line of the power module 10 is set to a length of 55 mm, and the thickness of the layer of the solder 71 is set to from about 0.050 mm to about 0.500 mm, the height of the protruding portions 12 and 13 from the bottom surface of the power module 10 is preferred to be set to about from 1.5 mm to about 3.0 mm in order to prevent the protruding portions 12 and 13 of the power module 10 from sliding out of the recessed portions 60a and 60b of the heat sink 60. The height of the protruding portions 12 and 13 is determined in proportion to the length of the diagonal line of the power module 10.

A power semiconductor device 1 according to a second embodiment of the present invention is described next with reference to FIG. 10 and FIG. 11.

Second Embodiment

The second embodiment differs from the first embodiment in that a guide member 90 is mounted to the control substrate 50. The rest of the configuration is the same as in the first embodiment.

Figure 10:
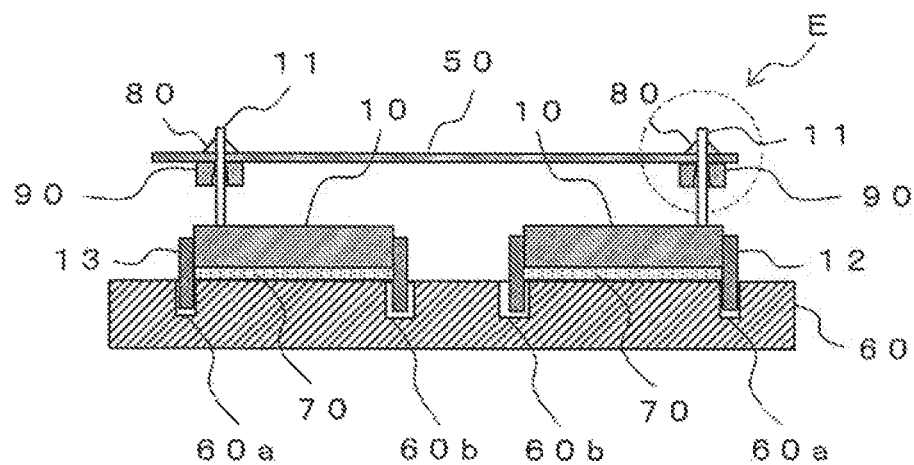
FIG. 10 is a sectional view of a power semiconductor device according to a second embodiment of the present invention.

As illustrated in FIG. 10, the guide member 90 used to guide the tips of the control terminals 11 into the mounting holes 40 of the control substrate 50 is mounted to the control substrate 50 of the second embodiment. The description given here takes as an example how the control substrate 50 is mounted to the control terminals 11 of each power module 10. However, the control substrate 50 is mounted to the control terminals 21 and 31 of the power modules 20 and 30 in the same manner as in the example.

The guide member 90 is formed from an insulative resin material having high heat resistance, for example, liquid crystal polymer resin or fluorine-based resin. The guide member is fixed to the back of a circuit surface of the control substrate 50 with a heat resistant adhesive or the like.

Figure 11:
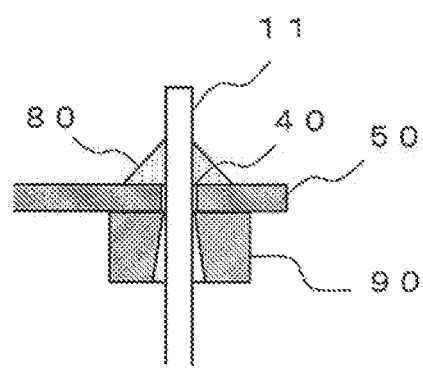
FIG. 11 is a partial enlarged view of FIG. 10.

FIG. 11 is an enlarged view of a portion E of FIG. 10. The guide member 90 is formed from a rectangular solid block material and, as illustrated in FIG. 11, tapered through-holes are formed in a middle portion of the guide member 90. Out of opening portions of each tapered through-hole, the smaller opening portion is formed to have an inner diameter large enough for one control terminal 11 to pass through. The guide member 90 is fixed with the opening portion smaller in inner diameter lined up with the corresponding one of the mounting holes 40 of the control substrate 50.

When the control substrate 50 is mounted to the control terminal 11, the tip of the control terminal 11 is touched to the opening portion of the guide member 90 that is larger in inner diameter, and is guided to the mounting hole 40 of the control substrate 50. Once the tip of the control terminal 11 protrudes through to the circuit surface side of the control substrate 50, the control substrate 50 and the control terminal 11 are fixed with the fixing material 80, which is solder or a similar material.

According to the power semiconductor device 1 of the second embodiment, the guide member 90 configured to guide the control terminals 11 to the mounting holes 40 is mounted to the control substrate 50 in this manner. This enables the plurality of control terminals 11 to be quickly positioned and inserted into the plurality of mounting holes 40 of the control substrate 50. The productivity of the power semiconductor device 1 can accordingly be improved.

The guide member 90 in the second embodiment is a rectangular solid block material in which tapered through-holes circular in cross section are formed, but is not limited thereto. For instance, the guide member 90 may be a columnar material in which tapered through-holes are formed, or the tapered through-holes may have a polygonal shape in cross section.

Third Embodiment

Figure 12:
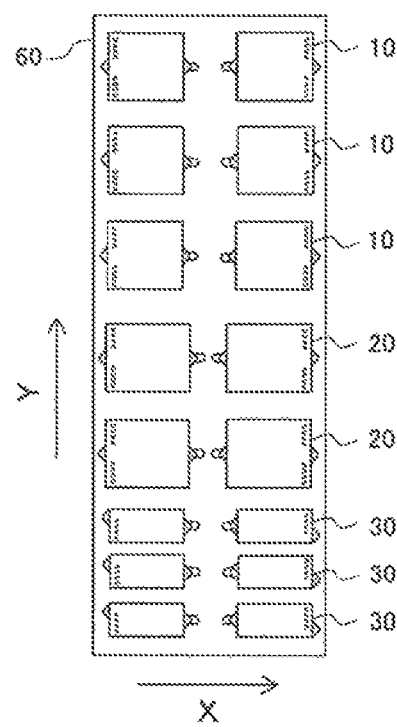
FIG. 12 is a top view for illustrating a direction X and a direction Y in each power semiconductor device according to the present invention.
Figure 13A:
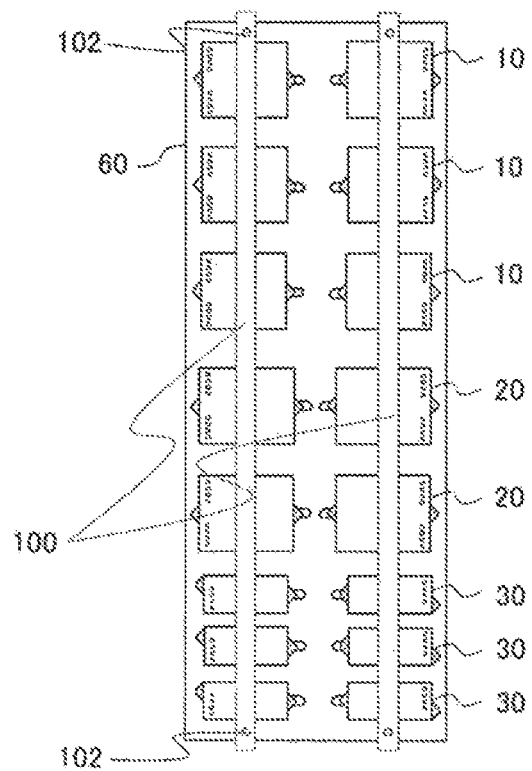
FIG. 13A is a top view of a power semiconductor device according to a third embodiment of the present invention.
Figure 13B:
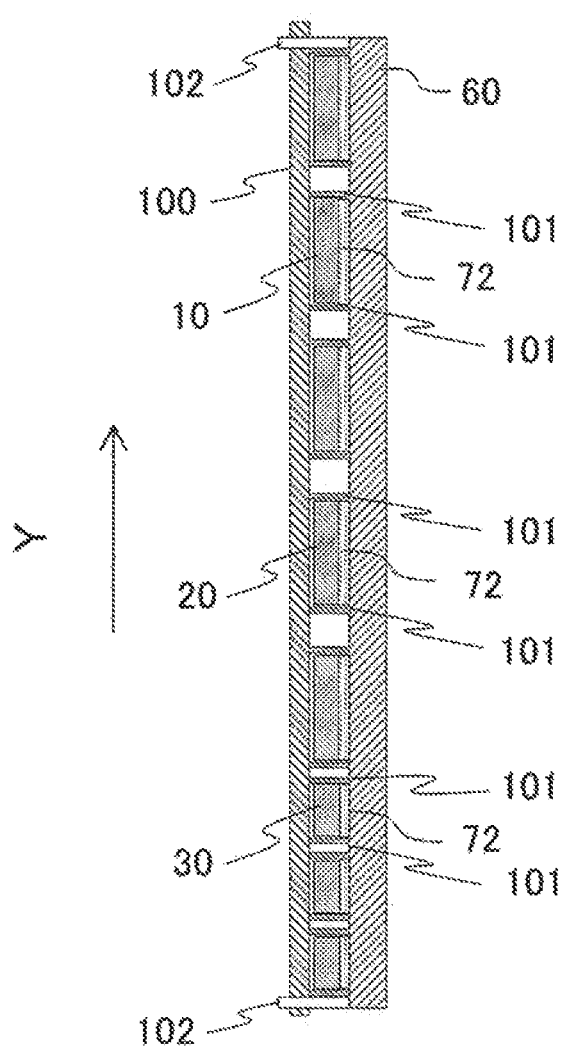
FIG. 13B is a diagram for illustrating a cross section of the power semiconductor device of FIG. 13A.

A third embodiment of the present invention is described with reference to FIG. 12, FIG. 13A, and FIG. 13B. FIG. 12 is a top view for illustrating a direction X and a direction Y in each power semiconductor device according to the present invention. FIG. 13A is a top view of a power semiconductor device according to the third embodiment. FIG. 13B is a diagram for illustrating a cross section of the power semiconductor device of FIG. 13A.

As a soldering method other than the method of the first embodiment in which the solder 71 mixed with a flux is used, there is a method in which the processing chamber is put under a reducing atmosphere by the time solder finishes melting to keep the solder material from having a reducing action. The reducing atmosphere requires balance between low oxygen concentration and oxidation-reduction actions, and it is preferred to set the atmosphere to H2, HCOOH, N2, or the like, and set the oxygen concentration to 10 ppm or less.

When this method is used, solder can be supplied in a bulk form in which a given amount is secured. The bulk form may be varied depending on the required volume and shape of a portion to be soldered, to be chosen from a thin sheet form, a spherical form, a cubic form, a rectangular solid form, and the like.

Solder having a bulk form does not contain a residual component unlike solder mixed with a flux, and accordingly does not require washing of the product after soldering. Another advantage is that maintenance, for example, cleaning due to contamination on soldering equipment, can be performed at a decreased frequency. On the other hand, bulk-form solder is a block of metal and accordingly has no viscosity, and thus the solder itself does not have a positioning function. When the solder is not positioned, the bulk-form solder is displaced from a predetermined position in some cases in a conveyance step prior to soldering by, for example, the bumping of the work over a joint portion between conveyance rails, or acceleration in acceleration/deceleration while the work is conveyed. As a result, a required amount of solder may not be charged in a required place, resulting in a fear of having defective soldering.

As illustrated in FIG. 12, each power module 10, each power module 20, and each power module 30 include a first protruding portion and a second protruding portion, and a positional shift of the bulk-form solder in the direction X can accordingly be regulated. The protruding portions, however, are incapable of regulating a positional shift in the direction Y. In addition, when bulk-form solder, particularly solder in a thin sheet form, is used to bond over a large area, the sheet-form solder is warped to generate an air space between the heat sink 60 and the solder, or between the solder and the power modules 10, as a factor hindering the evening out of heat.

Herein, the solder in a thin sheet form is sheet-form solder having a thickness of from about 0.100 mm to about 0.500 mm, and the bonding over a large area means the bonding of solder bonding surfaces each having a dimension of from about 10 mm to about 60 mm along one side.

When heat is not evened out satisfactorily during a heating process for soldering, the solder lopsidedly wets and spreads on one of the two surfaces to be joined that has exceeded the melting point of the solder. Consequently, the solder may fail to spread to a place in which soldering is required, which leads to a fear of having defective soldering.

In order to solve the two problems, namely, the positional shift of the solder in the direction Y and the evening out of heat when the solder having a sheet form is used, in the third embodiment, as illustrated in FIG. 13A, a block 100 made of metal high in heat conductivity is placed above the power modules 10, 20, and 30 along the longitudinal direction of the heat sink 60.

The metal block 100 forms a heat transmission path above the power modules 10, 20, and 30. As illustrated in FIG. 13B, the metal block 100 also regulates the position of sheet-form solder 72 in the direction Y with the use of protruding portions 101 protruding downward from the metal block 100. The metal block 100 is mounted to the heat sink 60 in a detachable manner. The metal block 100 is positioned on the heat sink 60 by a positioning pin 102 provided in at least each end portion of the metal block 100, and a positioning hole (not shown) formed in the heat sink 60. The positioning pin 102 may be provided on the heat sink 60 side while the positioning hole is formed in the metal block 100 side.

This stabilizes the quality of soldering, and improves the productivity of the power semiconductor device 1 as well. In addition, heat can be evened out in the large-sized power semiconductor device 1 conveyed into a furnace by placing the metal block 100 so that the metal block 100 stretches over the plurality of power modules 10, 20, and 30, which are aligned in a single line.

REFERENCE SIGNS LIST 1 power semiconductor device, 10 power module (first power module), 20 power module (second power module), 30 power module (third power module), 11, 21, 31 control terminal, 12, 22, 32 protruding portion (first protruding portion), 13, 23, 33 protruding portion (second protruding portion), 40 mounting hole (fixing portion), 50 control substrate, 60 heat sink, 60a, 60c, 60e recessed portion (first recessed portion), 60b, 60d, 60f recessed portion (second recessed portion), 70 fixing layer, 71, 72 solder (solder material), 80 fixing material, 90 guide member, 100 block

The invention claimed is:

1. A power semiconductor device, comprising:
a plurality of types of power modules, to which control terminals are mounted;
a heat sink, on which the plurality of types of power modules are mounted; and
a control substrate having fixing portions, to which the control terminals are fixed, formed thereon,
wherein the heat sink has a first surface and a second surface facing each other at an outermost edge of heat sink,
wherein the plurality of types of power modules each include a columnar first protruding portion and a second protruding portion, the columnar first protruding portion being provided in an end portion of a corresponding one of the plurality of types of power modules on a side thereof on which corresponding control terminals are mounted, the second protruding portion being provided in an end portion of the corresponding one of the plurality of types of power modules on an opposite side thereof from the end portion in which the columnar first protruding portion is provided,
wherein a positional relationship between the columnar first protruding portion and the second protruding portion varies from one type of power module of the plurality of types of power modules to another type of power module of the plurality of types of power modules,
wherein the heat sink has a cylindrical first recessed portion corresponding to the columnar first protruding portion, the first recessed portion provided proximate to the first surface of the heat sink and
an elongated-hole-shaped second recessed portion corresponding to the second protruding portion, the second recessed portion provided distal to the first surface of the heat sink,
wherein the plurality of types of power modules are each mounted on the heat sink so that the columnar first protruding portion is inserted into the cylindrical first recessed portion and the second protruding portion is inserted into the elongated-hole-shaped second recessed portion,
wherein a distance from the first surface to the first recessed portion is smaller than a distance from the first surface to the second recessed portion, and the distance from the first surface to the first recessed portion is smaller than a distance from the second surface to the second recessed portion, and
wherein a positional relationship of the columnar first protruding portion relative to a corner of the corresponding power module closest to the columnar first protruding portion and a positional relationship of the second protruding portion relative to a corner of the corresponding power module closest to the second protruding portion varies from one type of power module of the plurality of types of power modules to another type of power module of the plurality of types of power modules.

2. The power semiconductor device according to claim 1, wherein the plurality of types of power modules include a first power module, and a second power module which is a power module of a different type from the type of the first power module, and
wherein a first distance from the columnar first protruding portion to the second protruding portion in the first power module differs from a second distance in the second power module corresponding to the first distance.

3. The power semiconductor device according to claim 1, wherein the plurality of types of power modules include a first power module, and a third power module which is a different type from the first power module, and
wherein a first direction in which the second protruding portion is formed relative to a position at which the columnar first protruding portion is formed in the first power module differs from a second direction in the third power module corresponding to the first direction.

4. The power semiconductor device according to claim 1, wherein the columnar first protruding portion and the second protruding portion, of each of the plurality of types of power modules, are each formed from a resin material having a softening temperature of 270° C. or higher.

5. The power semiconductor device according to claim 2, wherein the columnar first protruding portion and the second protruding portion, of each of the plurality of types of power modules, are each formed from a resin material having a softening temperature of 270° C. or higher.

6. The power semiconductor device according to claim 3, wherein the columnar first protruding portion and the second protruding portion, of each of the plurality of types of power modules, are each formed from a resin material having a softening temperature of 270° C. or higher.

7. The power semiconductor device according to claim 1, wherein the control substrate includes a guide member configured to guide the control terminals to the fixing portions.

8. The power semiconductor device according to claim 2, wherein the control substrate includes a guide member configured to guide the control terminals to the fixing portions.

9. The power semiconductor device according to claim 3, wherein the control substrate includes a guide member configured to guide the control terminals to the fixing portions.

10. The power semiconductor device according to claim 1, wherein the plurality of types of power modules are each fixed to the heat sink by a fixing layer formed from a solder material having a bulk form.

11. The power semiconductor device according to claim 2, wherein the plurality of types of power modules are each fixed to the heat sink by a fixing layer formed from a solder material having a bulk form.

12. The power semiconductor device according to claim 3, wherein the plurality of types of power modules are each fixed to the heat sink by a fixing layer formed from a solder material having a bulk form.

13. The power semiconductor device according to claim 1, wherein a height of each of the plurality of types of power modules is the same.

14. The power semiconductor device according to claim 1, including a fourth power module and a fifth power module of the plurality of types of power modules,
wherein the fourth power module of the plurality of types of power modules has the columnar first protruding portion and the second protruding portion, the columnar first protruding portion being provided in an end portion of the fourth power module on a side thereof on which a first plurality of the control terminals are mounted, the second protruding portion being provided in an end portion of the fourth power module on an opposite side thereof from the end portion in which the columnar first protruding portion is provided,
wherein the fifth power module of the plurality of types of power modules has a columnar third protruding portion and a fourth protruding portion, the columnar third protruding portion being provided in an end portion of the fifth power module on a side thereof on which a second plurality of the control terminals are mounted, the fourth protruding portion being provided in an end portion of the fifth power module on an opposite side thereof from the end portion in which the columnar third protruding portion is provided,
wherein the heat sink has a cylindrical third recessed portion corresponding to the columnar third protruding portion, and an elongated-hole-shaped fourth recessed portion corresponding to the fourth protruding portion,
wherein the third recessed portion is provided proximate to the second surface of the heat sink,
wherein the fourth recessed portion is provided distal to the second surface of the heat sink,
wherein a distance from the second surface to the third recessed portion is smaller than a distance from the second surface to the fourth recessed portion, and the distance from the second surface to the third recessed portion is smaller than a distance from the first surface to the fourth recessed portion,
wherein the fourth power module is mounted on the heat sink so that the columnar first protruding portion is inserted into the cylindrical first recessed portion and the second protruding portion is inserted into the second recessed portion, and
wherein the fifth power module is mounted on the heat sink so that the columnar third protruding portion is inserted into the third recessed portion and the fourth protruding portion is inserted into the fourth recessed portion.

15. The power semiconductor device according to claim 14,
wherein the fourth recessed portion is arranged in a first straight line connecting a shortest distance between the first surface and the second recessed portion.

16. The power semiconductor device according to claim 15, further comprising:
a plurality of the first recessed portions arranged in a line perpendicular to the first straight line, and
a plurality of the third recessed portions arranged in a line perpendicular to the first straight line.

17. The power semiconductor device according to claim 15, further comprising:
a plurality of the second recessed portions arranged in a line perpendicular to the first straight line, and
a plurality of the fourth recessed portions arranged in a line perpendicular to the first straight line.

18. The power semiconductor device according to claim 1,
wherein at least one of the position of the columnar first protruding portion and the position of the second protruding portion varies from one type of power module of the plurality of types of power modules to another type of power module of the plurality of types of power modules.

19. A power semiconductor device, comprising:
a plurality of types of power modules, to which control terminals are mounted;
a heat sink, on which the plurality of types of power modules are mounted; and
a control substrate having fixing portions, to which the control terminals are fixed, formed thereon,
wherein the heat sink has a first surface and a second surface facing each other at an outermost edge of heat sink,
wherein the plurality of types of power modules each include a columnar first protruding portion and a second protruding portion, the columnar first protruding portion being provided in an end portion of a corresponding one of the plurality of types of power modules on a side thereof on which corresponding control terminals are mounted, the second protruding portion being provided in an end portion of the corresponding one of the plurality of types of power modules on an opposite side thereof from the end portion in which the columnar first protruding portion is provided, wherein a positional relationship between the columnar first protruding portion and the second protruding portion varies from one type of power module of the plurality of types of power modules to another type of power module of the plurality of types of power modules, wherein the heat sink has a cylindrical first recessed portion corresponding to the columnar first protruding portion, the first recessed portion provided proximate to the first surface of the heat sink and an elongated-hole-shaped second recessed portion corresponding to the second protruding portion, the second recessed portion provided distal to the first surface of the heat sink, wherein the plurality of types of power modules are each mounted on the heat sink so that the columnar first protruding portion is inserted into the cylindrical first recessed portion and the second protruding portion is inserted into the elongated-hole-shaped second recessed portion, wherein a distance from the first surface to the first recessed portion is smaller than a distance from the first surface to the second recessed portion, and the distance from the first surface to the first recessed portion is smaller than a distance from the second surface to the second recessed portion, wherein the plurality of types of power modules include a first power module, and a third power module which is a different type from the first power module, wherein a first direction in which the second protruding portion is formed relative to a position at which the columnar first protruding portion is formed in the first power module differs from a second direction in the third power module corresponding to the first direction, and wherein a distance between a side of the first power module where a corresponding columnar first protruding portion is provided and another side of the first power module where a corresponding second protruding portion is provided is equal to a distance between a side of the third power module where a corresponding columnar first protruding portion is provided and another side of the third power module provided where a corresponding second protruding portion is provided.

20. A method of manufacturing a power semiconductor device according to claim 11, the method comprising the steps of:

placing a solder material having a bulk form between the cylindrical first recessed portion and the elongated-hole-shaped second recessed portion of the heat sink;

aligning the columnar first protruding portion with the cylindrical first recessed portion to insert the columnar first protruding portion into the cylindrical first recessed portion, and inserting the second protruding portion into the elongated-hole-shaped second recessed portion;

placing the plurality of types of power modules onto the solder material with use of the columnar first protruding portion and the second protruding portion to regulate a positional shift of the solder material in a direction with which the cylindrical first recessed portion and the elongated-hole-shaped second recessed portion are aligned;

heating and melting the solder material; and performing vacuuming until an atmosphere of the solder material reaches 10 kPa or lower.

21. The method of manufacturing a power semiconductor device according to claim 20, further comprising, before the step of heating and melting the solder material, a step of placing a metal block, which includes a plurality of protruding portions protruding downward, so that the metal block stretches over the plurality of types of power modules, to thereby regulate, with use of the plurality of protruding portions, a positional shift of the solder material in a direction perpendicular to the direction with which the cylindrical first recessed portion and the elongated-hole-shaped second recessed portion are aligned.

* * * * *